(12) United States Patent
Maddox

(10) Patent No.: US 6,568,645 B2
(45) Date of Patent: May 27, 2003

(54) MOUNTING BRACKET FOR A UTILITY METER TRANSCEIVER UNIT

(75) Inventor: Michael F. Maddox, Westfield, IN (US)

(73) Assignee: Maddox Bracket Company, Westfield, IN (US)

( * ) Notice: Subject to any disclaimer, the term of this patent is extended or adjusted under 35 U.S.C. 154(b) by 35 days.

(21) Appl. No.: 09/996,195

(22) Filed: Nov. 28, 2001

(65) Prior Publication Data

US 2002/0063555 A1 May 30, 2002

Related U.S. Application Data

(60) Provisional application No. 60/253,475, filed on Nov. 28, 2000.

(51) Int. Cl.[7] ............................. A47B 96/06; A47R 5/00; F16L 3/08; F16M 13/00
(52) U.S. Cl. ..................... 248/231.81; 248/300; 248/65; 248/207; 248/544; 248/74.1
(58) Field of Search ........................... 248/231.81, 300, 248/65, 207, 544, 74.1; 73/856, 273, 272 R

(56) References Cited

U.S. PATENT DOCUMENTS

| | | | |
|---|---|---|---|
| 3,414,219 A | * | 12/1968 | Siegel .......................... 248/65 |
| 3,815,859 A | * | 6/1974 | Leopold, Jr. et al. ....... 248/300 |
| 3,865,338 A | * | 2/1975 | Campbell .................. 248/297.2 |
| 4,763,863 A | * | 8/1988 | Cote' ......................... 248/74.1 |
| 4,887,187 A | * | 12/1989 | Nickola ....................... 361/664 |
| 5,438,329 A | | 8/1995 | Gastouniotis et al. ....... 340/870 |
| 5,590,608 A | * | 1/1997 | Yore et al. ..................... 109/50 |
| 5,844,134 A | * | 12/1998 | Jiles ............................ 73/201 |
| 6,053,463 A | * | 4/2000 | Melvin ........................ 248/201 |
| 6,378,817 B1 | * | 5/2000 | Bublitz et al. .............. 248/200 |

OTHER PUBLICATIONS

Invensys Metering Systems, RadioRead AMR, Aug. 1999.

* cited by examiner

Primary Examiner—N. Le
Assistant Examiner—Wasseem H. Hamdan
(74) Attorney, Agent, or Firm—Clifford W. Browning; Woodard, Emhardt, Naughton, Moriarty & McNett L.L.P.

(57) ABSTRACT

A mounting bracket for a utility meter transceiver unit, consists of a main bracket piece having a first end and a second end, with a through opening at the first end sized to receive therethrough a utility pipe that is in communication with a utility meter, and with a receiving channel at the second end; an upright bracket piece having a third and fourth end, sized at the third end to be received within the receiving channel, and sized at the fourth end to be received within a mounting channel within a utility meter transceiver unit; and a device to adjust the relative positions of the fourth end of the upright bracket piece and the receiving channel.

6 Claims, 5 Drawing Sheets

MOUNTING BRACKET FOR A UTILITY METER TRANSCEIVER UNIT

This application claims the benefit of co-pending U.S. Provisional Patent Application Ser. No. 60/253,475, filed Nov. 28, 2000.

BACKGROUND OF THE INVENTION

Many municipal water districts have taken the water meter reading task hi-tech. For example, the TOUCHREAD brand automated water meter readers of INVENSYS Metering Systems of Uniontown, Pa., provide a portable sensor wand for direct contact with a water meter output pad that electronically transfers the water meter reading to a portable information storage unit connected to the sensor wand. For water meters located in a below ground meter box (pit), the TOUCHREAD brand water meter output pad is typically mounted in the meter box lid so the pad is flush with the top surface of the lid.

As water districts faced significant growth in water meter installations, many have chosen to save the labor costs associated with the hiring additional water meter readers by moving to RADIOREAD brand water meter readers, also of INVENSYS Metering Systems of Uniontown, Pa. The RADIOREAD brand meter readers utilize meter transceiver units to transmit water meter outputs by radio waves from the water meter to portable radio transceivers operated by the meter reader. Water meter output may thereby be accurately read without visual or wand contact with the water meter or with a TOUCHREAD brand water meter output pad, which offers a significant time saving method of meter reading. The radio waves generated by the RADIOREAD meter transceiver unit may even be read at any time of day or night by a vehicle transceiver of sufficient range that is located in any car or truck operated by the meter reader as the vehicle drives by a RADIOREAD-equipped water meter. The operations of the RADIOREAD brand meter readers are more fully described in U.S. Pat. No. 5,438,329.

However, there is not a really good or reasonable way to install the RADIOREAD brand meter transceiver units in below ground water meter pits, either new or existing, without creating a new hole in the meter pit. The manufacturer of the RADIOREAD brand meter transceiver unit suggests driving a length of ½ inch EMT conduit vertically into the ground at the bottom of the meter box with a hammer until the conduit is at a desired level. That desired level is determined to be the point at which the top of the RADIOREAD brand meter transceiver unit, when fully installed on the conduit, will be about 1 inch below the meter pit lid. After the conduit is driven into the bottom of the meter pit, the ½ inch tubular opening provide in the bottom surface of the RADIOREAD brand meter transceiver unit is placed over the conduit and pressed into place. The meter pit cover (lid) is then put into place and the installation is complete, according to the manufacturer. However, if the bottom of the meter pit does not have an opening that would permit the ½ inch EMT conduit to be driven into the ground with a hammer, the manufacturer states only that "a different mounting-method may need to be developed."

SUMMARY OF THE INVENTION

What has been needed is a mounting bracket that may be installed within the meter pit thereby eliminating the need to pound the ½ inch conduit into the ground below or otherwise creating new holes in the pit, and that will securely hold the ½ inch mounting conduit vertically to allow mounting the RADIOREAD brand meter transceiver unit in the pit at the appropriate level below the pit lid.

One embodiment of the mounting bracket of the present invention is a mounting bracket for a utility meter transceiver unit, comprising a main bracket piece having a first end and a second end, with a through opening at the first end sized to receive therethrough a utility pipe that is in communication with a utility meter, and with a receiving channel at the second end; an upright bracket piece having a third and fourth end, sized at the third end to be received within the receiving channel, and sized at the fourth end to be received within a mounting channel within a utility meter transceiver unit; and means to adjust the relative positions of the fourth end of the upright bracket piece and the receiving channel.

Another embodiment of the mounting bracket of the present invention is a mounting bracket for a water meter transceiver unit, comprising a main bracket piece having a first end and a second end, with a through opening at the first end sized to receive therethrough a water pipe that is in fluid communication with a water meter, and with a receiving channel at the second end; an upright bracket piece having a third end and a fourth end, sized at the third end to be received within the receiving channel and sized at the fourth end to be received within a mounting channel within a water meter transceiver unit; and means to adjust the relative positions of the fourth end of the upright bracket piece and the receiving channel.

Another embodiment of the mounting bracket of the present invention is a utility meter set, including a utility meter equipped to electronically transmit its meter readings; a utility meter transceiver unit in electrical communication with the utility meter equipped to retransmit the utility meter's meter readings and having a mounting channel therein; a main bracket piece having a first end and a second end, with a through opening at the first end sized to receive therethrough a utility pipe that is in communication with the utility meter, and with a receiving channel at the second end; an upright bracket piece having a third and fourth end, sized at the third end to be received within the receiving channel, and sized at the fourth end to be received within the utility meter transceiver unit's mounting channel; and means to adjust the relative positions of the fourth end of the upright bracket piece and the receiving channel.

Related objects the advantages of the present invention will become clear from the following written descriptions.

BRIEF DESCRIPTION OF THE DRAWING FIGURES

DETAILED DESCRIPTION OF THE PREFERRED EMBODIMENTS

Figure 1:
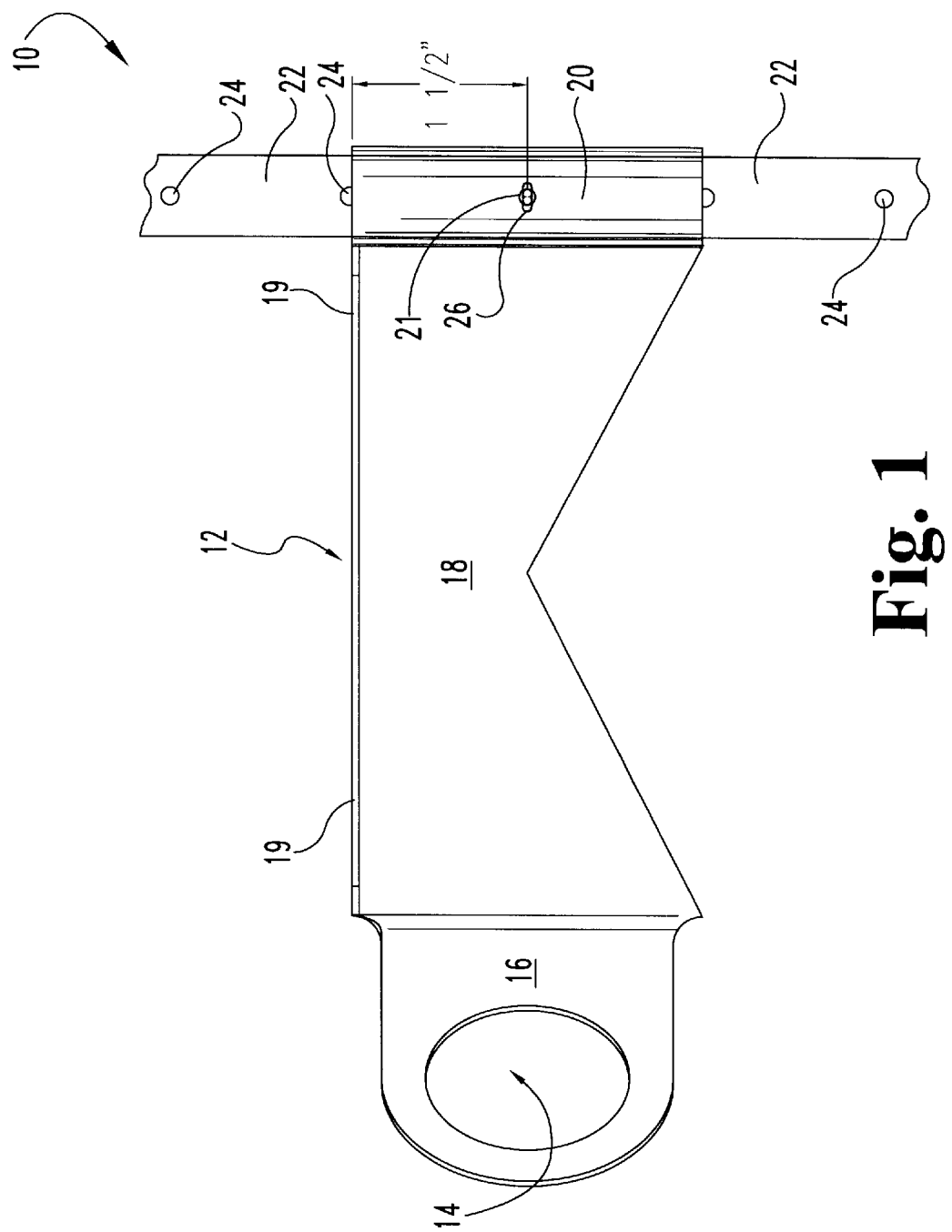
FIG. 1 is a front elevational view of the mounting bracket for a utility meter transceiver unit of the present invention.

Referring now to the drawings, detailed descriptions follow for how to construct and use the preferred embodiments to date of the mounting bracket 10 of the present invention on exemplary one-inch water meter sets and ⅝×¾ inch water meter sets.

Mounting Bracket of the Present Invention for a One Inch Meter Set

Figure 2:
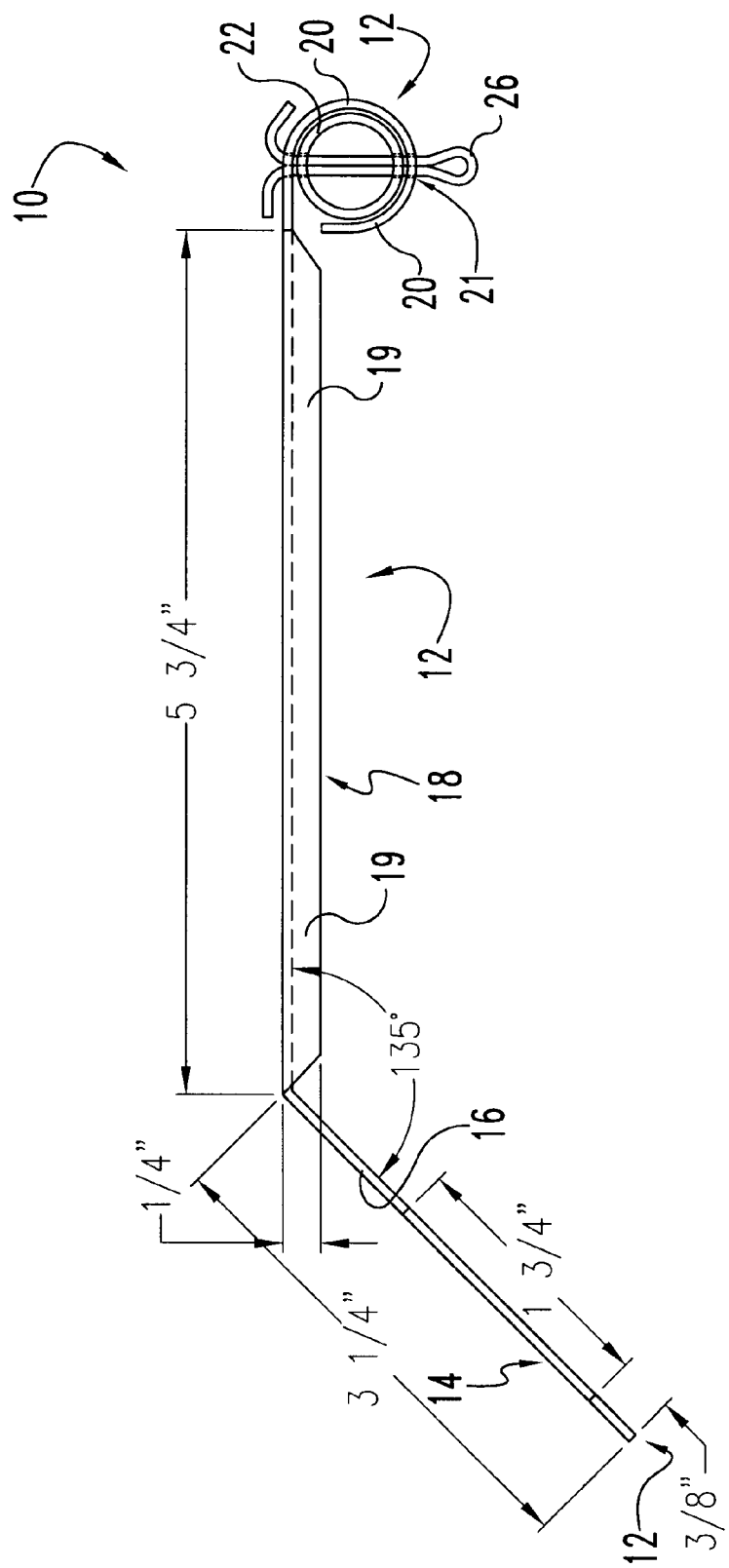
FIG. 2 is a top plan view of the mounting bracket of FIG. 1.
Figure 4:
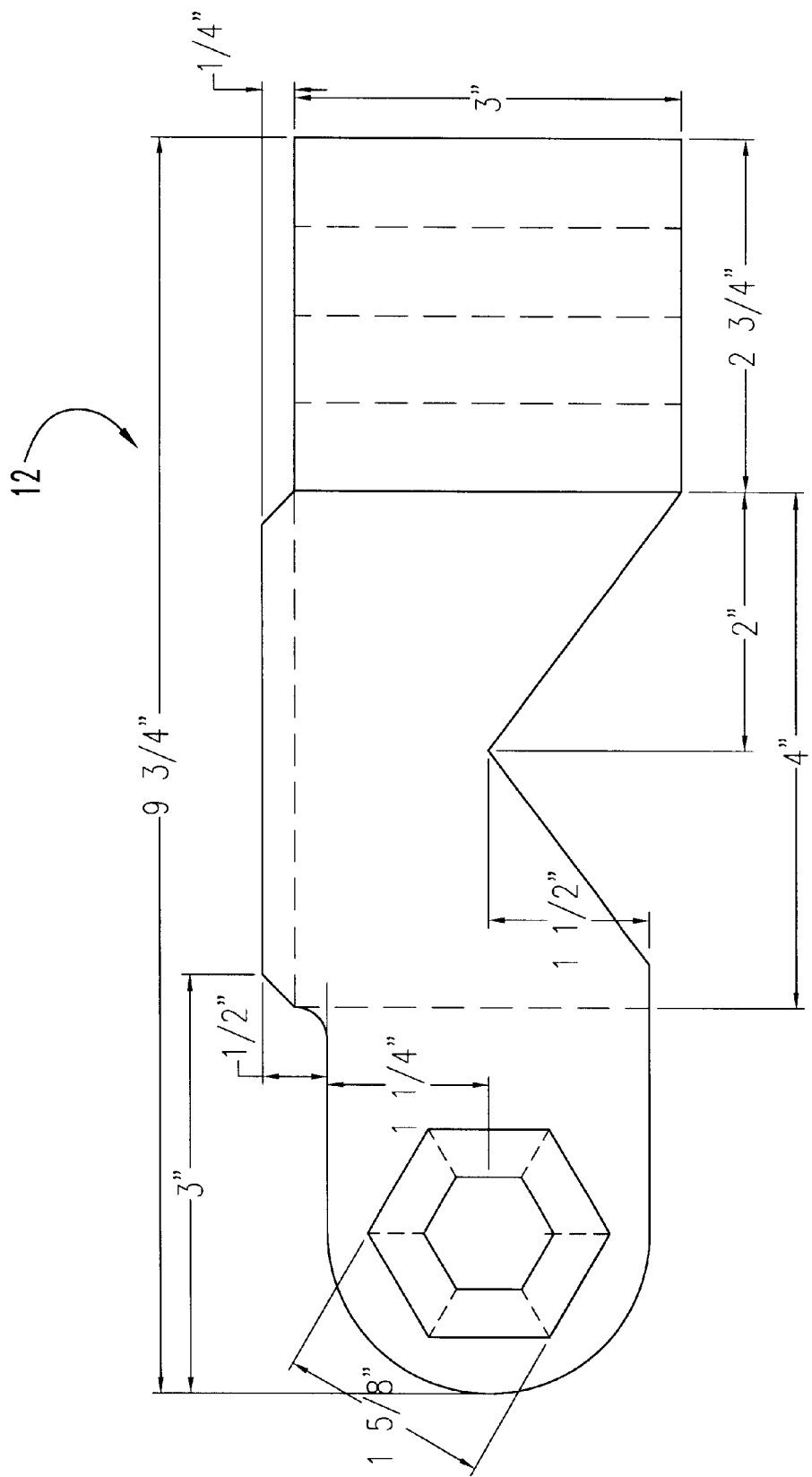
FIG. 4 is a front elevational view of a template for an alternative embodiment of the main bracket piece of the mounting bracket of FIG. 3.
Figure 5:
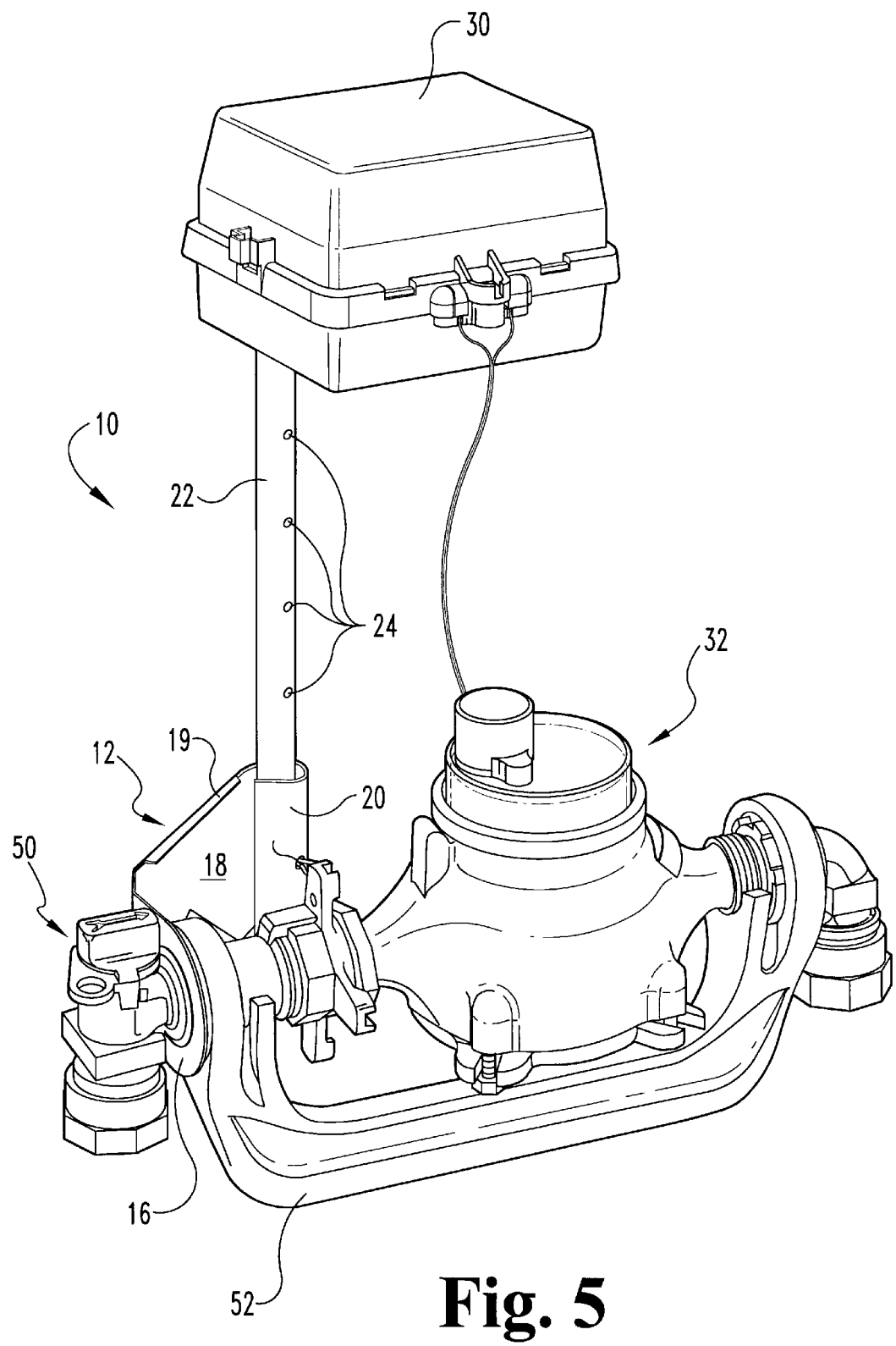
FIG. 5 is a perspective view of the mounting bracket of FIG. 1 installed on a one inch meter set.

Referring now to FIGS. 1, 2 and 5 and with general reference to the template of FIG. 4, to create the main bracket piece 12 of the mounting bracket 10 of the present invention for a one inch meter set, cut a piece of stainless steel ¹⁄₁₆ inch thick by 11⅞ inches long and 3¼ inches wide. Measure and place marks at 3¼ inches and 9 inches from one end of the piece. Using a square, draw a line at both marks. From the end to the 3¼-inch line, cut off ¼ inch from the top edge. From the other end to the 9-inch line, cut off ¼ inch from the top edge.

Drill a 1¾-inch hole 14 in the center of the resulting 3 by 3¼-inch piece 16. Using the illustration provided in FIG. 1 as an approximate pattern, trace a line on the 3×3¼ inch piece 16 around its end and around hole 14 as illustrated in FIG. 1.

On the middle section 18 of the main bracket piece 12 (5³³⁄₄×3¼) measure up 1½ inches from the bottom and 2¹³⁄₁₆ inches over from the 3¼ inch line (find middle of 5¾ inch middle section 18) and up 1½ inches and make a mark. Draw a line from each bottom corner to cross at the 1½ inch mark to make an upside down V. Cut out the upside down V.

Cut off the top corners of the 5¾ inch middle section 18.

Using a hammer and vise on the middle section 18, bend forward the top ¼-inch lip 20 at a 90 degree angle.

Mark ½-inch marks (for guides to roll) from the other end. Using a hammer and a vise, and a ½-inch conduit as a guide, pound and wrap the end around the conduit to form receiving channel 20. Do not over tighten. Measure down approximately 1½ inches from the top of receiving channel 20 and drill a ⁵⁄₃₂-inch through hole 21 through receiving channel 20.

Using a vice, bend the 3¼ inch section 16 forward to form an approximate 135 degree angle as illustrated in FIG. 2. To insure it has been bent properly, when installed on a one-inch meter set as described below, the receiving channel 20 should be approximately 1 to 2 inches from the meter 32.

The upright bracket piece 22 of the preferred embodiment of the mounting bracket of the present invention is a ½ inch stainless steel conduit that has been provide with a plurality of ⁵⁄₃₂ inch through holes 24, which is inserted into receiving channel 20 and is held in place therein by a cotter pin 26 through the through hole 21 in receiving channel 20 and though one of the through holes 24 in the upright bracket piece 22.

The ½ stainless steel conduit, which is the upright bracket piece 22 of the preferred embodiment to date, can be any length desirable for the operations of a given water utility department. The minimum length is 4 inches. As suggested by the manufacturer, when installed in a meter pit, the top of the RADIOREAD brand meter transceiver unit 30 should be about 1 to 6 inches below the meter pit lid when it is closed. The RADIOREAD brand meter transceiver unit 30 has a ½ inch diameter conduit insert on its bottom surface into which the ½ inch diameter stainless steel conduit of the preferred embodiment may be snuggly inserted to mount the RADIOREAD brand meter transceiver unit 30 to the mounting bracket 10 of the present invention.

Mounting Bracket of the Present Invention for a ⅝×¾ Meter Set

Figure 3:
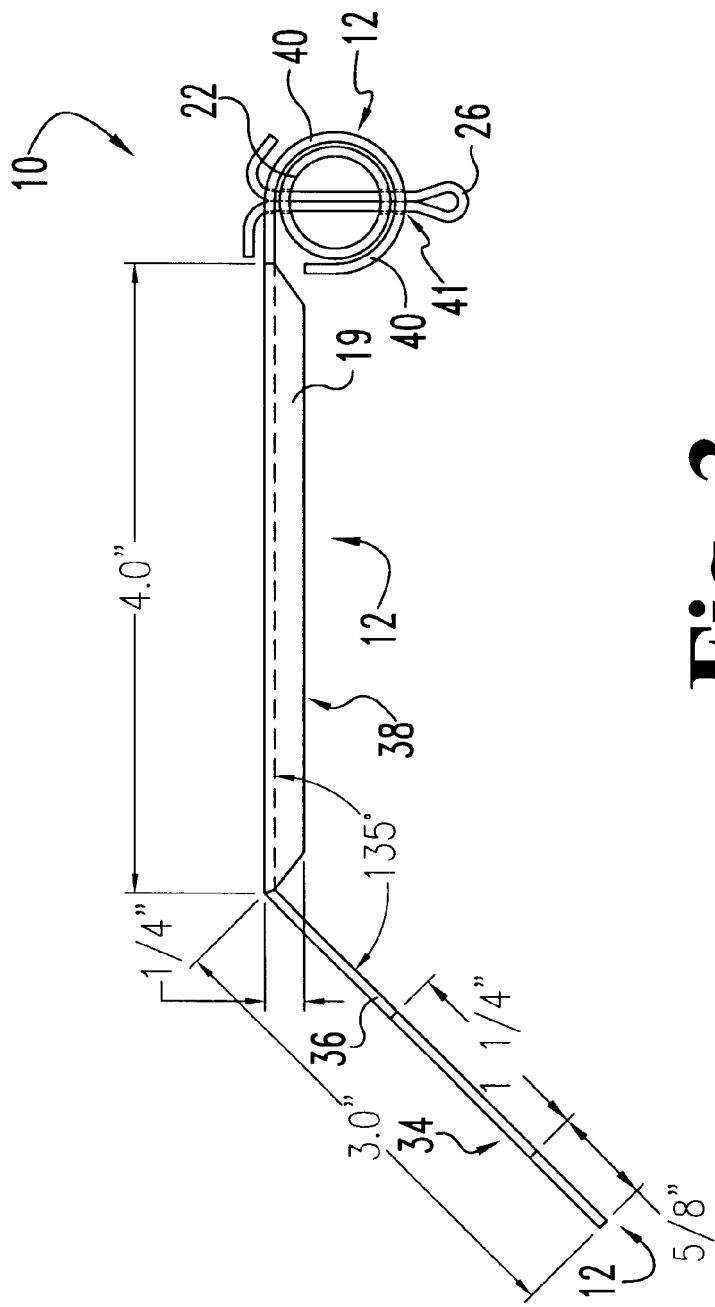
FIG. 3 is a top plan view of an alternative embodiment of the main bracket piece of the mounting bracket of FIG. 1.

Referring now to FIGS. 3 and 4, and with general reference to the template of FIG. 4, to create an alternative embodiment of main bracket piece 12 of the mounting bracket 10 for a ⅝×¾ inch meter set, cut a piece of stainless steel ⅙ inch thick by 9¾ inches long and 3¼ inches wide. Measure and place marks at 3 inches and 7 inches from one end of the piece. Using a square, draw a line at both marks. From the end to the 3-inch line, cut off ¼ inch from the top edge. From the other end to the 7-inch line, cut off ¼ inch from the top edge.

Drill a 1½-inch hole 34 in the center of the resulting 3-inch square piece 36. Using the illustrations in FIGS. 1-4 as approximate patterns, trace a line on the 3-inch square piece 36 around its end and around hole 34, as illustrated in FIGS. 1-4.

On the middle section 38 of the main bracket piece 12 of this embodiment (4×3¼) measure up 1½ inch from the bottom and 2 inches over from the 3 inch line (find the middle of 4 inches) and up 1½ inches, and make a mark. Draw a line from each bottom corner to cross at the 1½ inch mark to make an upside down V. Cut out the upside down V.

Cut off the top corners of the 4-inch middle section 38.

Using a hammer and a vise on the middle section 38, bend forward the top ¼-inch lip 39 at a 90-degree angle.

Mark ½-inch marks (for guides to roll) from the other end. Using a hammer and vise, and a ½-inch conduit as a guide, pound and wrap the end around the conduit to form receiving channel 40. Do not over tighten. Measure down approximately 1½ inches from the top of receiving channel 40 and drill a ⁵⁄₃₂-inch through hole 41 through receiving channel 40.

Using a vice, bend the 3-inch section forward at approximately a 135 degree angle, as illustrated in FIG. 3. To insure it has been bent properly, when installed on a ⅝ by ¾-inch meter set as described below, the receiving channel 40 is to be 1 to 2 inches from the meter 32.

The upright bracket piece 22 of the preferred embodiment of the mounting bracket of the present invention, which is a ½ inch stainless steel conduit that has been provide with a plurality of ⁵⁄₃₂ inch through holes 24, is used in this embodiment in the same manner as set forth above for the one inch meter set.

Referring now to FIG. 4, illustrated is another alternative embodiment of the main bracket piece 12 of the present invention for a ⅝×¾ meter set, which is shown in elevational view before any bending has been done, as discussed above. The principal difference is that the embodiment of FIG. 4 has a 1⅝-inch hexagonal opening in place of the through hole 34 of the previous embodiment. The hexagonal opening is also provided with six ⅜-inch tabs that are bendable to bend the hexagonal opening over a setter nut on a meter set that does not utilize a yoke as illustrated in FIG. 5.

Referring now to FIG. 5, the mounting bracket 10 of the present invention installs in a typical new or existing water meter pit, without drilling or driving holes in the pit, in the following manner. Simply turn off the water supply to the pit, remove the water meter 32 and spanner nut, and then take the water turn off valve 50 away from the meter's yoke 52. The mounting bracket 10 of the present invention is installed on the shutoff valve 50 between the shut off valve 50 and the meter yoke 52. Retighten the spanner nut, place the meter 32 back in pit, and insure the meter is tight. Turn on the water supply and check for leaks.

As described the mounting bracket 10 of the present invention may be easily installed in new or existing water meter pits. The mounting bracket 10 has been illustrated as being installed on the turn off valve side of a meter pit set, but it may be installed on either side of the yoke 52. As described, the meter 32 can be removed without removing the mounting bracket 10.

The mounting bracket 10 of the present invention will fit into single or double water meter pit sets. Although it has been described above in use in a water meter pit, it may also be used in basement installations. It fits FORD and MUELLER brand brass equally well.

Although described for use in mounting a RADIOREAD brand meter transceiver unit, the mounting bracket 10 of the present invention may also be used to mount the TOUCHREAD brand meter output pads, or other utility meter transceiver units, as well.

I claim:

1. A mounting bracket for a utility meter transceiver unit, comprising a main bracket piece having a first end and a second end, with a through opening at the first end sized to receive therethrough a utility pipe that is in communication with a utility meter, and with a receiving channel at the second end;

an upright bracket piece having a third and fourth end, sized at the third end to be received within the receiving channel, and sized at the fourth end to be received within a mounting channel within a utility meter transceiver unit; and means to adjust the relative positions of the fourth end of the upright bracket piece and the receiving channel.

2. A mounting bracket for a water meter transceiver unit, comprising a main bracket piece having a first end and a second end, with a through opening at the first end sized to receive therethrough a water pipe that is in fluid communication with a water meter, and with a receiving channel at the second end;

an upright bracket piece having a third end and a fourth end, sized at the third end to be received within the receiving channel and sized at the fourth end to be received within a mounting channel within a water meter transceiver unit; and means to adjust the relative positions of the fourth end of the upright bracket piece and the receiving channel.

3. The mounting bracket of claim 1 wherein the first end of the main bracket piece protrudes outwardly from the main bracket piece at an angle of about 135 degrees.

4. The mounting bracket of claim 2 wherein the first end of the main bracket piece protrudes outwardly from the main bracket piece at an angle of about 135 degrees.

5. A utility meter set, including a utility meter equipped to electronically transmit its meter readings;

a utility meter transceiver unit in electrical communication with the utility meter equipped to retransmit the utility meter's meter readings and having a mounting channel therein;

a main bracket piece having a first end and a second end, with a through opening at the first end sized to receive therethrough a utility pipe that is in communication with the utility meter, and with a receiving channel at the second end;

an upright bracket piece having a third and fourth end, sized at the third end to be received within the receiving channel, and sized at the fourth end to be received within the utility meter transceiver unit's mounting channel; and means to adjust the relative positions of the fourth end of the upright bracket piece and the receiving channel.

6. The mounting bracket of claim 5 wherein the first end of the main bracket piece protrudes outwardly from the main bracket piece at an angle of about 135 degrees.

* * * * *